(12) United States Patent
Bernal et al.

(10) Patent No.: US 11,268,987 B2
(45) Date of Patent: Mar. 8, 2022

(54) CIRCUIT INTERRUPTER AND METHOD OF ESTIMATING A TEMPERATURE OF A BUSBAR IN A CIRCUIT INTERRUPTER

(71) Applicant: EATON INTELLIGENT POWER LIMITED, Dublin (IE)

(72) Inventors: Leonardo E. Bernal, Raleigh, NC (US); Daniel A. Hosko, Pittsburgh, PA (US); John E. Downs, Hopedale, OH (US); Theodore J. Miller, McDonald, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 205 days.

(21) Appl. No.: 16/578,971

(22) Filed: Sep. 23, 2019

(65) Prior Publication Data

US 2021/0088556 A1 Mar. 25, 2021

(51) Int. Cl.
*G01R 31/00* (2006.01)
*G01R 15/18* (2006.01)
(Continued)

(52) U.S. Cl.
CPC .......... *G01R 15/181* (2013.01); *G01R 23/02* (2013.01); *G01R 31/2874* (2013.01); *H03H 7/12* (2013.01)

(58) Field of Classification Search
CPC .. G01R 15/181; G01R 15/185; G01R 15/202; G01R 15/205; G01R 15/207;
(Continued)

(56) References Cited

U.S. PATENT DOCUMENTS 4,855,671 A * 8/1989 Fernandes .............. G01R 15/26
324/127
5,461,309 A 10/1995 Baudart
(Continued)

FOREIGN PATENT DOCUMENTS

JP 2005 003601 A 1/2005

OTHER PUBLICATIONS

European Patent Office "extended European search report" for corresponding EP application No. 20196551.4, dated Feb. 23, 2021.

*Primary Examiner* — Thang X Lez
(74) *Attorney, Agent, or Firm* — Eckert Seamans Cherin & Mellott, LLC

(57) ABSTRACT

A circuit interrupter including a busbar, a Rogowski coil disposed around the busbar and structured to sense current having a first frequency flowing through the busbar, a test injector circuit structured to input a test signal having a second frequency to the Rogowski coil, high or band pass filter circuitry structured to receive an output of the Rogowski coil, the output including a first component having the first frequency and being proportional to the current through the busbar and a second component having the second frequency and being proportional to a temperature of the Rogowski coil, and to attenuate the first component of the Rogowski coil output, and an electronic trip unit including a temperature measurement unit structured to receive an output of the high or band pass filter circuitry and to estimate the temperature of the busbar based on the output of the high or band pass filter circuitry.

20 Claims, 5 Drawing Sheets

(51) Int. Cl.
*G01R 23/02* (2006.01)
*G01R 31/28* (2006.01)
*H03H 7/12* (2006.01)

(58) Field of Classification Search
CPC ........ G01R 15/14; G01R 15/18; G01R 15/22; G01R 15/23; G01R 19/02; G01R 19/10; G01R 19/18; G01R 19/22; G01R 19/25145; G01R 19/165; G01R 19/175; G01R 23/02; G01R 31/2874
See application file for complete search history.

(56) References Cited

U.S. PATENT DOCUMENTS

| | | | |
|---|---|---|---|
| 2004/0178875 A1* | 9/2004 | Saito | G01R 19/2513 336/200 |
| 2012/0105052 A1 | 5/2012 | Niemann | |
| 2014/0253108 A1* | 9/2014 | Singh | G01R 15/20 324/227 |
| 2015/0372478 A1* | 12/2015 | Zhou | G01K 13/00 361/93.8 |
| 2017/0122995 A1 | 5/2017 | Voisine, Jr. | |
| 2019/0078943 A1* | 3/2019 | Nakayama | G01K 7/427 |

* cited by examiner

CIRCUIT INTERRUPTER AND METHOD OF ESTIMATING A TEMPERATURE OF A BUSBAR IN A CIRCUIT INTERRUPTER

BACKGROUND

Field

The disclosed concept relates generally to circuit interrupters, and in particular, to estimating the temperature of a busbar of a circuit interrupter.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit breakers typically include separable contacts. The separable contacts may be operated either manually by way of an operator handle or automatically in response to a detected fault condition. Typically, such circuit breakers include an operating mechanism, which is designed to rapidly open and close the separable contacts, and a trip mechanism, such as a trip unit, which senses a number of fault conditions to trip the breaker automatically. Upon sensing a fault condition, the trip unit causes the operating mechanism to trip open the separable contacts.

Busbar temperature data can be used to diagnose the health of a circuit and assess whether the circuit is operating as intended. For example, if the connections between conductors on a busbar are not sufficiently tight, the additional resistance will heat the busbar, leading to accelerated wear of breaker parts.

Although having a system in place to measure the temperature of a busbar for diagnostics is useful, implementing such a system using temperature sensors presents several challenges. The high voltage present on conductors within a circuit interrupter necessitates that a sensor used to measure temperature of a busbar be electrically isolated. A busbar temperature sensor also needs to be capable of operating at high temperatures during standard breaker operation. In addition to the electrical and thermal constraints presented by using temperature sensors to measure the temperature of the local bus, use of temperature sensors in a circuit breaker presents nontrivial design difficulties, as the ability to run sensors on the busbar and run cables back to the electronic trip unit for communication is constrained by the limited internal space in the breaker. There is room for improvement in sensing temperatures of busbars in circuit interrupters.

SUMMARY

These needs and others are met by embodiments of the disclosed concept in which a Rogowski coil is disposed around the busbar of a circuit breaker to sense the current flowing through the busbar and the resistance of the Rogowski coil is used to determine the temperature of the busbar without the use of a temperature sensor.

In accordance with one aspect of the disclosed concept, a circuit interrupter comprises: a busbar, a Rogowski coil disposed around the busbar and structured to sense current having a first frequency flowing through the busbar; a test injector circuit structured to input a test signal having a second frequency to the Rogowski coil; high pass or band pass filter circuitry structured to receive an output of the Rogowski coil, the output including a first component having the first frequency and being proportional to the current flowing through the busbar and a second component having the second frequency and being proportional to a temperature of the Rogowski coil, and to attenuate the first component of the output of the Rogowski coil; and an electronic trip unit including a temperature measurement unit structured to receive an output of the high pass or band pass filter circuitry and to estimate the temperature of the busbar based on the output of the high pass or band pass filter circuitry.

In accordance with another aspect of the disclosed concept, a method for estimating a temperature of a busbar in a circuit interrupter comprises: providing a Rogowski coil disposed around the busbar and structured to sense current having a first frequency flowing through the busbar; injecting a test input signal having a second frequency into the Rogowski coil disposed around the busbar; receiving an output of the Rogowski coil with high pass or band pass filter circuitry, the output including a first component having the first frequency and being proportional to the current flowing through the busbar and a second component having the second frequency and being proportional to a temperature of the Rogowski coil; filtering the output of the Rogowski coil with the high pass or band pass filter circuitry and attenuating the first component of the output of the Rogowski coil; receiving an output of the high pass or band pass filter circuitry with a temperature measurement unit in an electronic trip unit of the circuit interrupter; and estimating the temperature of the busbar based on the output of the high pass or band pass filter circuitry.

In accordance with another aspect of the disclosed concept, a circuit interrupter comprises: a busbar; a Rogowski coil disposed around the busbar and structured to sense current flowing through the busbar; a test injector circuit structured to input a test signal to the Rogowski coil; high pass or band pass filter circuitry structured to receive and high pass or band pass filter an output of the Rogowski coil; and an electronic trip unit including a temperature measurement unit structured to receive an output of the high pass or band pass filter circuitry and to estimate the temperature of the busbar based on the output of the high pass or band pass filter circuitry and a current measurement unit structured to receive an output of the Rogowski coil and estimate the current flowing through the busbar based on the output of the Rogowski coil.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
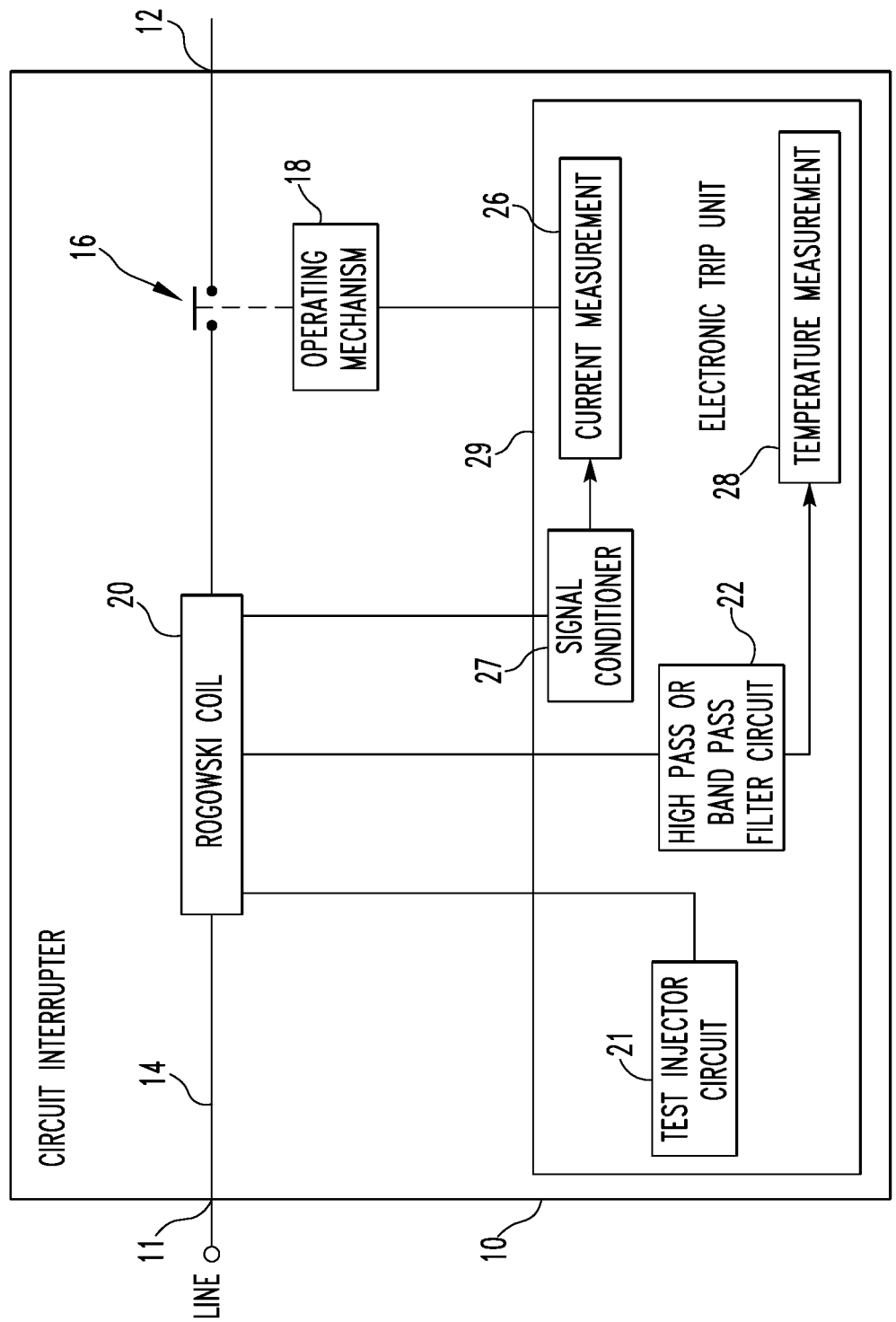
FIG. 1 is a schematic view of a circuit interrupter in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

Figure 2:
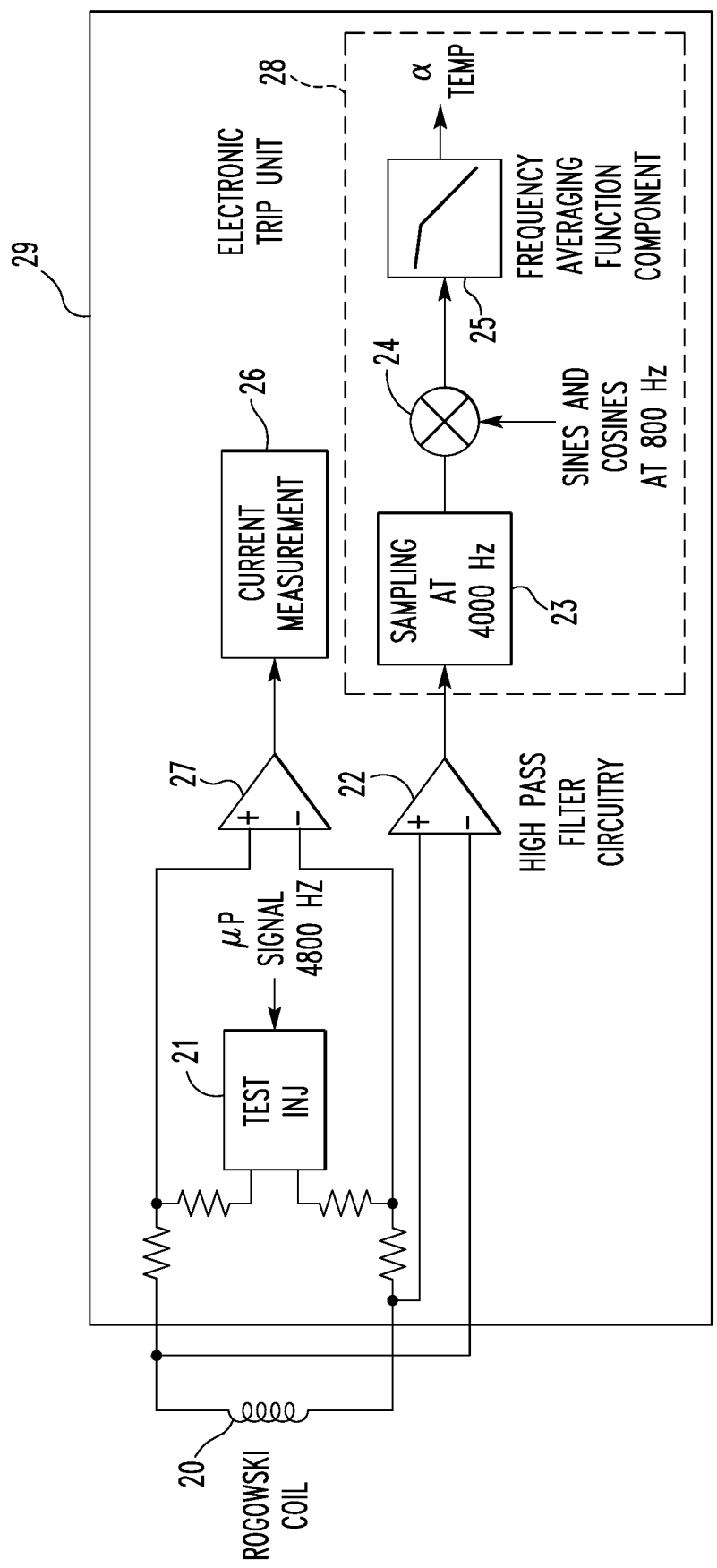
FIG. 2 is a schematic diagram of the circuit interrupter of FIG. 1 shown in more detail in accordance with an example embodiment of the disclosed concept.

FIG. 1 is a schematic diagram of a circuit interrupter 10 in accordance with an example embodiment of the disclosed concept and FIG. 2 is a schematic diagram of the circuit interrupter 10 of FIG. 1 shown in more detail in accordance with an example embodiment of the disclosed concept. The circuit interrupter 10 includes a first terminal 11, a second terminal 12, and separable contacts 16. The circuit interrupter 10 further includes a line conductor 14, connecting the first and second terminals 11 and 12. The line conductor 14 may be comprised of one or more busbars. The separable contacts 16 are disposed along the line conductor 14 and tripping open the separable contacts 16 stops current from flowing through the line conductor 14 from the first terminal 11 to the second terminal 12. The circuit interrupter 10 further includes an operating mechanism 18 structured to trip open the separable contacts 16.

The circuit interrupter 10 further includes a Rogowski coil 20 disposed around and structured to sense current flowing through the line conductor 14 (i.e., the busbars of the line conductor 14) of the circuit interrupter 10. However, it will be appreciated that the Rogowski coil may also be employed to sense current flowing through a neutral conductor without departing from the scope of the disclosed concept. The current flowing through the line conductor 14 is expected to have a frequency of about 60 Hz, or the standard frequency of current provided by a utility. The circuit interrupter 10 further includes a signal conditioner 27 electrically connected to the Rogowski coil 20, and a current measurement unit 26 used to determine the current flowing through the line conductor 14 based on the output of the signal conditioner 27. The signal conditioner 27 may be analog or digital, and may perform amplification and/or integration functions.

The circuit interrupter 10 further includes a test injector circuit 21 electrically connected to the Rogowski coil 20. The test injector circuit 21 is structured to input a test signal to the Rogowski coil 20 to be processed by a temperature measurement unit 28 in order to determine the temperature of the Rogowski coil 20, which provides an estimate of the temperature of the line conductor 14. In some example embodiments, the test signal input to the Rogowski coil 20 has a frequency substantially higher than the frequency of the current flowing through the line conductor 14. The higher frequency test signal is attenuated by the current measurement components such as the signal conditioner 27 and the current measurement unit 26 such that the test signal does not interfere with the measurement of current flowing through the line conductor 14.

The circuit interrupter 10 further includes high pass or band pass filter circuitry 22 electrically connected to the Rogowski coil 20. The high pass or band pass filter circuitry 22 is structured to receive the output of the Rogowski coil 20, which is comprised of two component signals. The first component signal is proportional to the utility current flowing through the line conductor 14. The first component is induced in the Rogowski coil 20 by the current flowing through the line conductor 14. The second component signal is the test signal input to the Rogowski coil 20 by the test injector circuit 21 and is proportional to the temperature of the Rogowski coil 20. For example, as the temperature of the Rogowski coil 20 increases or decreases, the resistance of the coils in the Rogowski coil 20 changes. Such changes in resistance cause changes in the magnitude of the test signal. The high pass or band pass filter circuitry 22 passes and amplifies the second component (i.e., the test input signal proportional to the temperature of the Rogowski coil) and attenuates the first component (i.e. the signal induced by the utility current flowing through the line conductor 14).

Figure 3A:
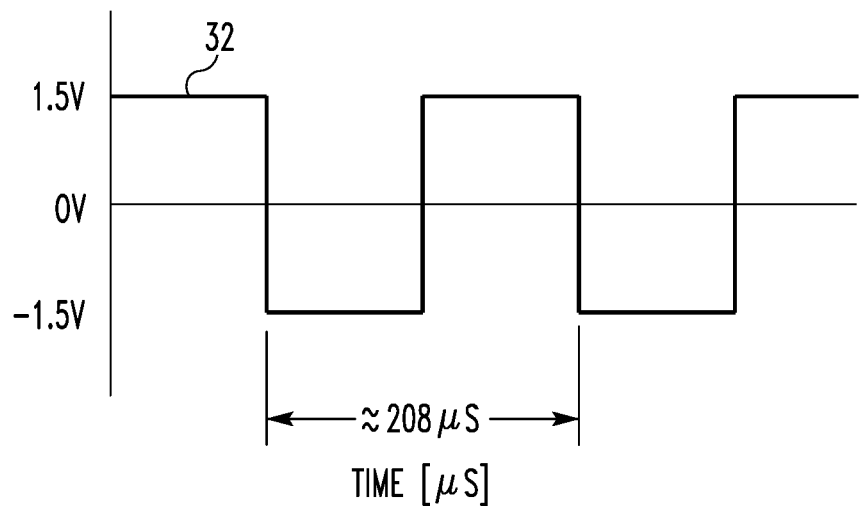
FIG. 3A is a graph of the waveform of a test signal input to a Rogowski coil disposed around a busbar of a circuit interrupter in accordance with an example embodiment of the disclosed concept.
Figure 3B:
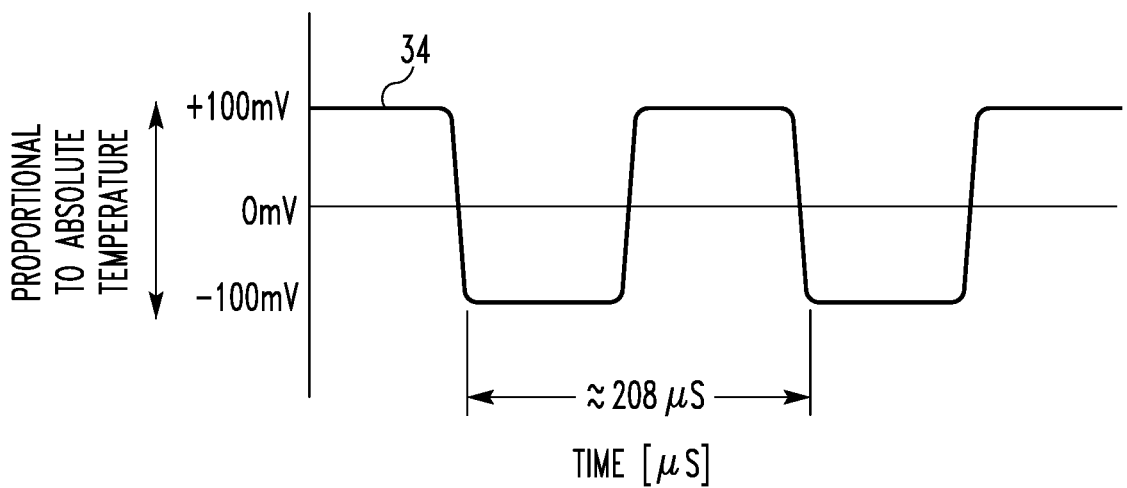
FIG. 3B is a graph of the waveform of a signal proportional to a temperature of the Rogowski coil after high pass or band pass filtering in accordance with an example embodiment of the disclosed concept.

For example, FIG. 3A shows a graph of a waveform 32 of a test signal generated by the test injector circuit 21 and having a frequency of 4800 Hz that is input to the Rogowski coil 20 of the circuit interrupter 10. FIG. 3B shows a graph of a waveform 34 of a 4800 Hz signal output by the high pass or band pass filter circuitry 22 after receiving the 4800 Hz output of the Rogowski coil 20. The amplitude difference between the FIG. 3B graph of waveform 34 of the output of the high pass or band pass filter circuitry 22 and the FIG. 3A graph of test signal waveform 32 demonstrates that a test input signal with a properly chosen frequency will be passed by the high pass or band pass filter circuitry 22, while the utility current signal will be attenuated. While 4800 Hz is an example of a frequency that a test signal and output of the high pass or band pass filter circuitry may have, it will be appreciated that other frequencies may be employed without departing from the scope of the disclosed concept. While 1.5 V is used in FIG. 3A as an example of an amplitude that waveform 32 may have and 100 mV is used in FIG. 3B as an example of an amplitude that waveform 34 may have, it will be appreciated that other voltage amplitudes may be employed without departing from the scope of the disclosed concept.

The circuit interrupter 10 further includes an electronic trip unit 29, which contains the test injector circuit 21, the high pass or band pass filter circuitry 22, the temperature measurement unit 28, the signal conditioner 27, and the current measurement unit 26. The current measurement unit 26 receives the output of the signal conditioner 27 and is structured to measure current flowing through the line conductor 14 based on the output of the signal conditioner 27. The temperature measurement unit 28 receives the output of the high pass or band pass filter circuitry 22 and is structured to estimate a temperature of the line conductor 14 based on the output of the high pass or band pass filter circuitry 22. The electronic trip unit 29 is structured to detect faults in the circuit interrupter 10 based on the sensed current. In response to detecting a fault, the electronic trip unit 29 is structured to cause the operating mechanism 18 to trip open the separable contacts 16. Independently of the fault detection function, the temperature of the line conductor 14 estimated by the temperature measurement unit 28 can be used to detect an overtemperature condition. An overtemperature condition may be indicative of loose wiring connections on the busbar. The detection of an overtemperature condition will cause an alarm to sound or produce another type of alert, indicating that the busbar wiring may need to be inspected.

The temperature measurement unit 28 includes a sampling component 23 (shown in FIG. 2) structured to receive the output of the high pass or band pass filter circuitry 22. The sampling component 23 is structured to sample the output of the high pass or band pass filter circuitry 22 at a sampling rate that results in a sampling output signal with substantially the same amplitude of the input signal to the sampling component 23. It will be appreciated by those having ordinary skill in the art that the sampling rate used by the sampling component 23 may be either greater than or less than the Nyquist rate. If a sampling rate less than the Nyquist rate is used, the sampling output signal will be an alias of the original test signal. In some example embodiments, using a sampling rate lower than the Nyquist rate can use less processing resources in the electronic trip unit 29. The sampling rate can be chosen to be consistent with the rate already being used by the electronic trip unit to read currents and may result in aliasing of the high pass or band pass filter circuitry 22 output. It will be appreciated by those having ordinary skill in the art that undersampling at a properly chosen rate will result in a sampling output signal that preserves the RMS amplitude information about the input signal to the sampling component 23.

Figure 4:
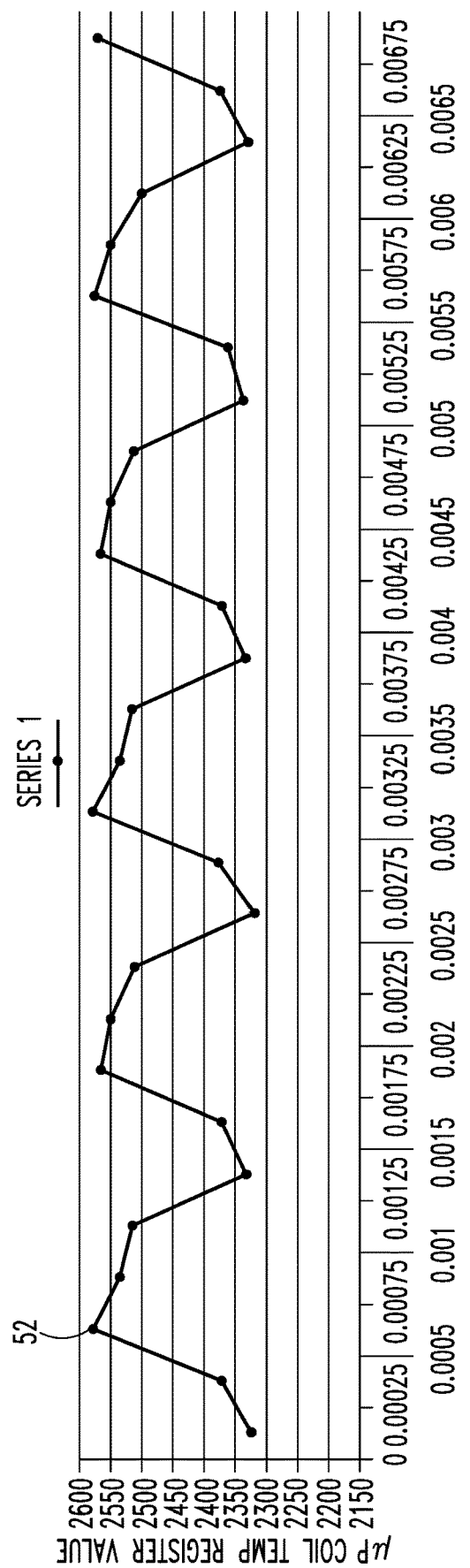
FIG. 4 is a graph of an output signal of a sampling component of a temperature measurement unit of an electronic trip unit of a circuit interrupter in accordance with an example embodiment of the disclosed concept.

For example, in FIG. 3B, after a 4800 Hz test injection signal (shown in FIG. 2) is input to the Rogowski coil 20 and the output of the Rogowski coil 20 is input to the high pass or hand pass filter circuitry 22, a 4800 Hz output signal 34 is output from the high pass or band pass filter circuitry 22. In FIG. 4, the 4800 Hz high pass or band pass filter output signal 34 is input to the sampling component 23, which undersamples signal 34 at a rate of 4000 Hz (shown in FIG. 2). This results in an 800 Hz sampling component output signal 52 with an amplitude proportional to the test injection signal input waveform. While 4000 Hz is an example of a frequency at which a sampling component may sample and an example of a rate which may already be employed by the electronic trip unit to read currents, it will be appreciated that other frequencies may be employed by the sampling component without departing from the scope of the disclosed concept. While sampling a 4800 Hz high pass filter output signal at a rate of 4000 Hz results in an example 800 Hz sampling component output signal, it will be appreciated that sampling component output signals of other frequencies may be produced without departing from the scope of the disclosed concept, as the frequency of the sampling component output signal is dependent upon both the frequency of the high pass or band pass filter output signal and the sampling rate employed by the sampling component.

The temperature measurement unit 28 further includes a frequency multiplier or mixer component 24 structured to receive the output of the sampling component 23. The multiplier or frequency mixer component 24 is structured to either multiply the output of the sampling component 23 by sine and cosine signals of the same frequency as the sampling component output signal or frequency mix the output of the sampling component 23 in order to eliminate any unwanted signals of other frequencies that may be components of the output signal of the sampling component, such as harmonics of the utility current signal. It will be appreciated by those of ordinary skill in the art that unwanted signals and their harmonics can be removed by choosing a proper averaging time. For example, by averaging the output of the sampling component 23 over an integer multiple of the utility period and its harmonics, the net resultant signal at the unwanted utility frequency and its harmonic frequencies will be zero.

The temperature sensing unit 26 further includes a frequency averaging function component 25 structured to remove all but the DC component from the output signal of the multiplier or frequency mixer component 24. The temperature sensing unit 26 also includes a processor that computes the resistance of the Rogowski coil 20 from the output of the frequency averaging function component 25 using the current through the Rogowski coil 20, the ambient temperature, and the temperature coefficient of the windings of the Rogowski coil 20. As the resistance of the windings of the Rogowski coil 20 varies with temperature, the resistance is indicative of the temperature of the windings of the Rogowski coil 20, which in turn is an estimate of the temperature of the busbar 14. In an example embodiment, the temperature measurement unit 28 may output an alarm when the estimated temperature (based on the resistance of the windings of the Rogowski coil 20) meets or exceeds a predetermined threshold level.

Figure 5:
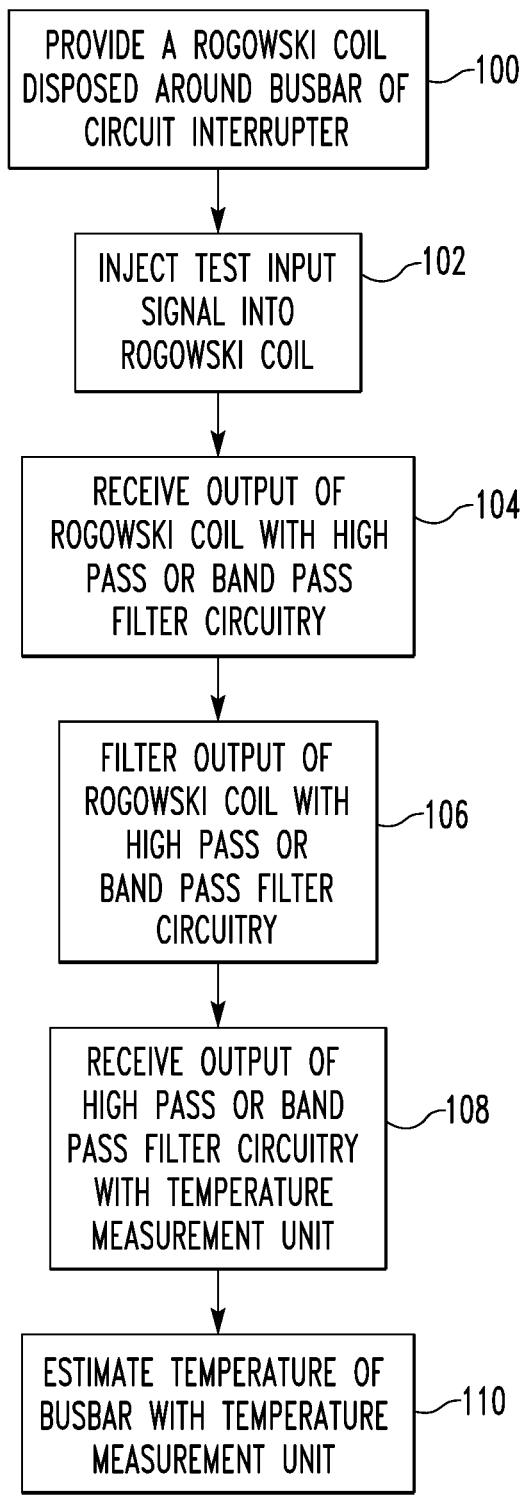
FIG. 5 is a flow chart of a method of estimating the temperature of a busbar in a circuit interrupter in accordance with an example embodiment of the disclosed concept.

FIG. 5 is a flowchart of a method of estimating a temperature of a busbar in accordance with an example embodiment of the disclosed concept. The method of FIG. 5 may be employed, for example, with the circuit interrupter 10 shown in FIGS. 1 and 2, and is described in conjunction with the circuit interrupter 10 shown in FIGS. 1 and 2. However, it will be appreciated that the method may be employed in other devices as well without departing from the scope of the disclosed concept.

The method begins at 100 where the Rogowski coil 20 disposed around the busbar 14 of the circuit interrupter 10 is provided. At 102, a test input signal is injected into the Rogowski coil 20. At 104, an output of the Rogowski coil 20 is received by the high pass or band pass filter circuitry 22. At 106, the output of the Rogowski coil 20 is filtered with the high pass or band pass filter circuitry 22. At 108, an output of the high pass or band pass filter circuitry 22 is received by the temperature measurement unit 28. At 110, the temperature of the busbar 14 is estimated with the temperature measurement unit 28.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter comprising:
   a busbar;
   a Rogowski coil disposed around the busbar and structured to sense current having a first frequency flowing through the busbar;
   a test injector circuit structured to input a test signal having a second frequency to the Rogowski coil;
   high pass or band pass filter circuitry structured to receive an output of the Rogowski coil, the output including a first component having the first frequency and being proportional to the current flowing through the busbar and a second component having the second frequency and being proportional to a temperature of the Rogowski coil, and to attenuate the first component of the output of the Rogowski coil; and
   an electronic trip unit including a temperature measurement unit structured to receive an output of the high pass or band pass filter circuitry and to estimate the temperature of the busbar based on the output of the high pass or band pass filter circuitry.

2. The circuit interrupter of claim 1, wherein the second frequency is substantially higher than the first frequency.

3. The circuit interrupter of claim 1, wherein the second frequency is at least three times the first frequency.

4. The circuit interrupter of claim 2, wherein the electronic trip unit includes current measurement circuitry structured to receive the output of the Rogowski coil and to attenuate the second component having the second frequency.

5. The circuit interrupter of claim 1, wherein the temperature measurement unit includes a sampling component structured to sample the output of the high pass or band pass filter circuitry at a third frequency,
wherein an output of the sampling component has a fourth frequency,
wherein the temperature measurement unit includes a frequency multiplier or frequency mixer component structured to multiply or frequency mix the output of the sampling component by sines and cosines of the fourth frequency,
wherein the temperature measurement unit includes a frequency averaging function component structured to remove all but a DC component from an output of the frequency multiplier or frequency mixer component, and
wherein the temperature measurement unit includes a temperature calculation component structured to calculate the temperature of the Rogowski coil.

6. The circuit interrupter of claim 5, wherein the output of the sampling component is a signal with an amplitude proportional to an amplitude of the output of the high pass or band pass filter circuitry.

7. The circuit interrupter of claim 5, wherein the fourth frequency is an alias frequency of the test signal.

8. The circuit interrupter of claim 1, further comprising:
a first terminal;
a second terminal;
separable contacts moveable between a closed position and an open position,
the first and second terminals being electrically disconnected from each other when the separable contacts are in the open position;
an operating mechanism structured to open said separable contacts; and
an actuator structured to cooperate with said operating mechanism to trip open said separable contacts.

9. A method for estimating a temperature of a busbar in a circuit interrupter, the method comprising:
providing a Rogowski coil disposed around the busbar and structured to sense current having a first frequency flowing through the busbar;
injecting a test input signal having a second frequency into the Rogowski coil disposed around the busbar;
receiving an output of the Rogowski coil with high pass or band pass filter circuitry, the output including a first component having the first frequency and being proportional to the current flowing through the busbar and a second component having the second frequency and being proportional to the temperature of the Rogowski coil;
filtering the output of the Rogowski coil with the high pass or band pass filter circuitry and attenuating the first component of the output of the Rogowski coil;
receiving an output of the high pass or band pass filter circuitry with a temperature measurement unit in an electronic trip unit of the circuit interrupter; and
estimating the temperature of the busbar based on the output of the high pass or band pass filter circuitry.

10. The method of claim 9, wherein the second frequency is substantially higher than the first frequency.

11. The method of claim 9, wherein the second frequency is at least three times the first frequency.

12. The method of claim 9, wherein the electronic trip unit includes current measurement circuitry structured to receive the output of the Rogowski coil and to attenuate the second component having the second frequency.

13. The method of claim 9, wherein the temperature measurement unit includes a sampling component structured to sample the output of the high pass or band pass filter circuitry at a third frequency,
wherein an output of the sampling component has a fourth frequency,
wherein the temperature measurement unit includes a frequency multiplier or frequency mixer component structured to multiply or frequency mix the output of the sampling component by sines and cosines of the fourth frequency,
wherein the temperature measurement unit includes a frequency averaging function component structured to remove all but a DC component from an output of the frequency multiplier or frequency mixer component, and
wherein the temperature measurement unit includes a temperature calculation component structured to calculate the temperature of the Rogowski coil.

14. The method of claim 13, wherein the output of the sampling component is a signal with an amplitude proportional to an amplitude of the output of the high pass or band pass filter circuitry.

15. The method of claim 13, wherein the fourth frequency is an alias frequency of the test signal.

16. The method of claim 9, wherein the circuit interrupter includes:
a first terminal;
a second terminal;
separable contacts moveable between a closed position and an open position,
the first and second terminals being electrically disconnected from each other when the separable contacts are in the open position;
an operating mechanism structured to open said separable contacts; and
an actuator structured to cooperate with said operating mechanism to trip open said separable contacts.

17. A circuit interrupter comprising:
a busbar;
a Rogowski coil disposed around the busbar and structured to sense current flowing through the busbar;
a test injector circuit structured to input a test signal to the Rogowski coil;
high pass or band pass filter circuitry structured to receive and filter an output of the Rogowski coil; and
an electronic trip unit including a temperature measurement unit structured to receive an output of the high pass or band pass filter circuitry and to estimate the temperature of the busbar based on the output of the high pass or band pass filter circuitry and a current measurement unit structured to receive an output of the Rogowski coil and estimate the current flowing through the busbar based on the output of the Rogowski coil.

18. The circuit interrupter of claim 17, wherein the temperature measurement unit includes a sampling component structured to sample the output of the high pass or band pass filter circuitry, wherein the temperature measurement unit includes a frequency multiplier or frequency mixer component structured to frequency multiply or frequency mix an output of the sampling component, wherein the temperature measurement unit includes a frequency averaging function component structured to remove all but a DC component from an output of the frequency multiplier or frequency mixer component, and wherein the temperature measurement unit includes a temperature calculation component structured to calculate the temperature of the Rogowski coil.

19. The circuit interrupter of claim 18, wherein the output of the sampling component is a signal with an amplitude proportional to an amplitude of the output of the high pass or band pass filter circuitry.

20. The circuit interrupter of claim 17, further comprising:
a first terminal;
a second terminal;
separable contacts moveable between a closed position and an open position, the first and second terminals being electrically disconnected from each other when the separable contacts are in the open position;
an operating mechanism structured to open said separable contacts; and
an actuator structured to cooperate with said operating mechanism to trip open said separable contacts.

* * * * *